(12) United States Patent
Tu

(10) Patent No.: US 6,902,975 B2
(45) Date of Patent: Jun. 7, 2005

(54) NON-VOLATILE MEMORY TECHNOLOGY COMPATIBLE WITH 1T-RAM PROCESS

(75) Inventor: Kuo-Chi Tu, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 10/686,106

(22) Filed: Oct. 15, 2003

(65) Prior Publication Data

US 2005/0085038 A1 Apr. 21, 2005

(51) Int. Cl.$^7$ ............................................. H01L 21/336
(52) U.S. Cl. ........................ 438/257; 438/353; 438/359
(58) Field of Search ................................. 438/257, 275, 438/294, 296, 307, 353, 359

(56) References Cited

U.S. PATENT DOCUMENTS

| | | |
|---|---|---|
| 4,441,249 A * | 4/1984 | Alspector et al. ........... 438/396 |
| 5,598,367 A | 1/1997 | Noble |
| 5,933,748 A * | 8/1999 | Chou et al. ................. 438/431 |
| 6,141,242 A | 10/2000 | Hsu et al. |
| 6,165,845 A | 12/2000 | Hsieh et al. |
| 6,222,216 B1 | 4/2001 | Rao et al. |
| 6,256,248 B1 | 7/2001 | Leung |
| 6,277,686 B1 | 8/2001 | Yeh et al. |
| 6,380,581 B1 | 4/2002 | Noble et al. |
| 6,468,855 B2 | 10/2002 | Leung et al. |
| 6,509,595 B1 | 1/2003 | Leung et al. |
| 6,528,422 B1 | 3/2003 | Huang et al. |
| 6,556,477 B2 | 4/2003 | Hsu et al. |

* cited by examiner

*Primary Examiner*—Phuc T. Dang
(74) *Attorney, Agent, or Firm*—Slater & Matsil, L.L.P.

(57) ABSTRACT

Methods of fabricating memory devices having non-volatile and volatile memory are provided. A substrate is provided, wherein the substrate has a non-volatile memory region and a volatile memory region. The non-volatile memory region has a storage device, such as a split-gate transistor, that is fabricated in substantially the same process steps as a storage capacitor of the volatile memory region. The reduction of process steps allow mixed memory to be fabricated in a cost effective manner.

21 Claims, 9 Drawing Sheets

FIG. 16

NON-VOLATILE MEMORY TECHNOLOGY COMPATIBLE WITH 1T-RAM PROCESS

TECHNICAL FIELD

The present invention relates to the field of semiconductor devices, and more specifically, to semiconductor devices having a split-gate flash and a 1T-RAM memory device.

BACKGROUND

With the increasing array density of successive generations of non-volatile memory chips, it is desirable to incorporate and merge other functions, and thus other devices, onto the non-volatile memory chips. Many times, however, the non-volatile memory chips incorporating other functions and technologies are not cost competitive as compared to the alternative of combining separate chips at the card or package level, each being produced with independently optimized technologies. Any significant addition of process steps to an existing non-volatile memory technology in order to provide added functions, such as high speed logic, SRAM, or DRAM, rapidly becomes cost prohibitive due to the added process complexity and decreased yield.

Incorporating 1T-RAM capability into a non-volatile memory chip is one of the desired features. The 1T-RAM offers combinations of high density, low power consumption, high speed, low cost easily compatible with logic and other embedded memory processes. One advantage of the 1T-RAM cell compared to an SRAM cell is its significantly smaller size (about one-third to about one-fourth the size of an SRAM cell), and one advantage of the 1T-RAM cell compared to a DRAM cell is its simplicity of integration in standard logic processes.

Thus, there is a need for non-volatile memory chips having other circuitry, such as 1T-RAM cells, incorporated on a non-volatile memory chip.

SUMMARY OF THE INVENTION

These and other problems are generally reduced, solved or circumvented, and technical advantages are generally achieved, by embodiments of the present invention which provides a method of manufacturing semiconductor devices having a non-volatile memory cell and a 1T-RAM cell.

In one embodiment of the present invention, a method of forming a split-gate transistor and a capacitor is provided. In the preferred embodiment, the split-gate transistor comprises a non-volatile memory and the capacitor comprises a volatile memory cell, such as a 1T-RAM memory cell.

In another embodiment of the present invention, the split-gate transistor and capacitor are formed on a substrate having a shallow trench isolation formed therein. A portion of the shallow trench isolation is removed to form the pattern of the bottom electrode of the capacitor. A dielectric layer is formed, and a polysilicon layer is formed on the dielectric layer. The polysilicon layer is patterned and an oxidation process is performed, thereby forming the poly-oxide layer of the split-gate transistor. The polysilicon layer is patterned to form the top electrode of the capacitor and the floating gate of the split-gate transistor. Thereafter, normal processing steps may be performed to form other structures.

In yet another embodiment of the present invention, the split-gate transistor and capacitor are formed on a substrate having a shallow trench isolation formed therein. A portion of the shallow trench isolation is removed to form the pattern of the bottom electrode of the capacitor. A dielectric layer is formed, and a polysilicon layer is formed on the dielectric layer. The polysilicon layer is patterned to form a poly-oxide layer of the split-gate transistor form a poly-oxide defining the area of the polysilicon that is to become the top electrode of the capacitor. Thereafter, normal processing steps may be performed to form other structures.

BRIEF DESCRIPTION OF THE DRAWINGS

For a more complete understanding of the present invention, and the advantage thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that embodiments of the present invention provide many applicable inventive concepts that can be embodied in a wide variety of specific contexts. The specific embodiments discussed are merely illustrative of specific ways to make and use the invention, and do not limit the scope of the invention.

For example, one embodiment of the present invention is a memory device including a non-volatile memory cell and a volatile memory cell. The discussions that follow describe a process of fabricating a memory device in which the non-volatile memory cell includes a split-gate transistor and the volatile memory includes a 1T-RAM cell. The split-gate transistor and the 1T-RAM cell are provided for illustrative purposes only. Accordingly, aspects of the present invention may be used in other embodiments, such as embodiments utilizing DRAM, SRAM, EEPROM, and the like.

FIGS. 1–11 illustrate cross-section views of a wafer 100 during various steps of one embodiment of the present invention in which a memory having a split-gate non-volatile memory cell and a volatile 1T-RAM cell is fabricated. For purposes of illustration, FIGS. 1–11 illustrate a portion of a volatile memory region 110, a non-volatile memory region 112, and a logic region 114. Generally, the volatile memory region 110 includes, for example, a memory having storage devices, storage capacitors, storage transistors, and devices required to access the storage devices. The non-volatile memory region 112 includes, for example, split-gate transistors, non-volatile storage capacitors, and the like. The logic region 114 includes, for example, sense amplifiers, transistors, capacitors, and other logic circuits that control the reading to and writing from the memory cell. In the embodiment illustrated in FIGS. 1–11, the volatile memory region 110 contains a 1T-RAM cell, the non-volatile memory region 112 contains a split-gate transistor, and the logic region 114 contains transistors for illustrative purposes only. It should be noted that only a portion of each region is shown in FIGS. 1–11. Accordingly, each region may include other components, such as capacitors, transistors, lines, isolation structures, or the like.

Furthermore, it should be noted that the preferred embodiment illustrated in FIGS. 1–11 depicts distinct and separate regions for the volatile memory region 110, the non-volatile memory region 112, and the logic region 114 for illustrative purposes only. Embodiments of the present invention may be used wherein the regions are spaced apart and/or intermixed within one region.

Figure 1:
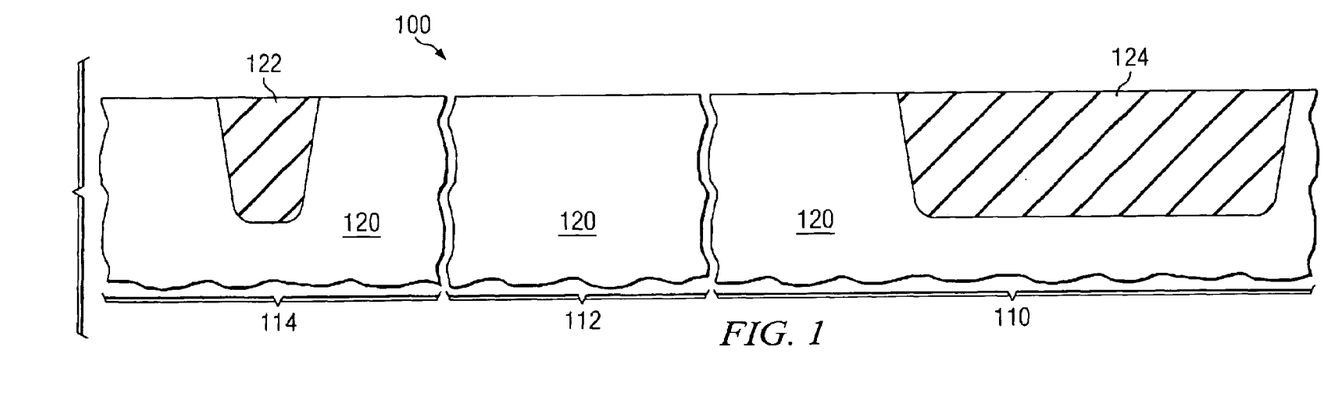
FIGS. 1–11 are cross-section views of a portion of a memory illustrating a first method embodiment of fabricating a non-volatile memory cell and a volatile memory cell in accordance with one embodiment of the present invention.

Referring first to FIG. 1, a wafer 100 has been prepared by forming on a substrate 120 shallow trench isolations (STIs) 122 and 124. The STIs 122 and 124 are generally formed by etching the substrate to form a trench and filling the trench with a dielectric material as is known in the art. Preferably, the STIs 122 and 124 are filled with a dielectric material such as an oxide material, a high-density plasma (HDP) oxide, or the like, formed by conventional methods. The resulting wafer is planarized, preferably by a chemical-mechanical polishing (CMP) using an oxide slurry, to form the wafer 100 shown in FIG. 1. Furthermore, n-wells and p-wells (not shown) may be formed in the substrate 120.

The substrate 120 is preferably a silicon substrate, which is typically undoped, but may be lightly doped. Other materials, such as silicon-on-insulator (SOI), germanium, quartz, sapphire, and glass could alternatively be used for the substrate 120.

Figure 2:
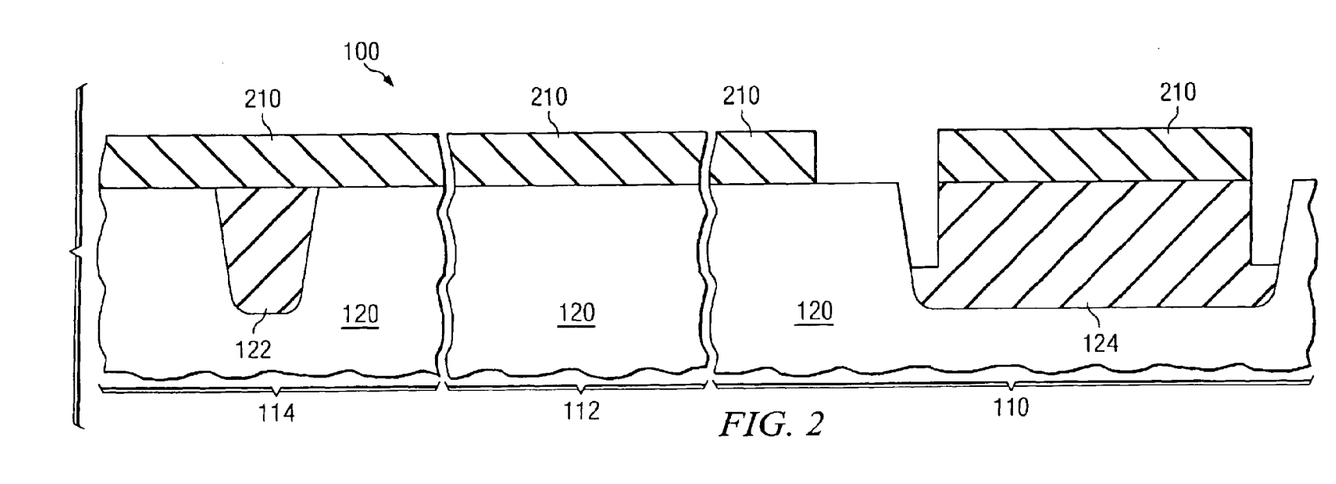

FIG. 2 illustrates the wafer 100 of FIG. 1 after a patterned mask 210 is formed and STI 124 has been etched. The patterned mask 210 preferably comprises a pad oxide layer and a hard mask that has been patterned using photolithography techniques as is known in the art. The pad oxide layer may be formed, for example, by an oxidation process. The oxidation step may be, for example, a wet or dry oxidation process such as wet or dry thermal oxidation in an ambient comprising an oxide, $H_2O$, NO, or a combination thereof, or by chemical vapor deposition (CVD) techniques using tetra-ethyl-ortho-silicate (TEOS): and oxygen as a precursor. Preferably, the pad oxide layer is about 20 Å to about 500 Å in thickness. The hard mask layer is preferably silicon nitride ($Si_3N_4$) formed by CVD techniques using silane and ammonia as precursor gases to a thickness of about 500 Å to about 1500 Å. The hard mask layer and the pad oxide layer may be patterned by, for example, a dry plasma etch process using fluorine chemistry.

After the patterned mask 210 has been formed, an etching process is performed to pattern the STI 124 in the volatile memory region 10. As illustrated in FIG. 2, the fill material along the edges of STI 124 is removed, thereby exposing a portion of the substrate along the top edges of the STI 124. As will be described below, the exposed portion of the substrate will become the bottom plate of storage capacitors for the 1T-RAM cell.

Figure 3:
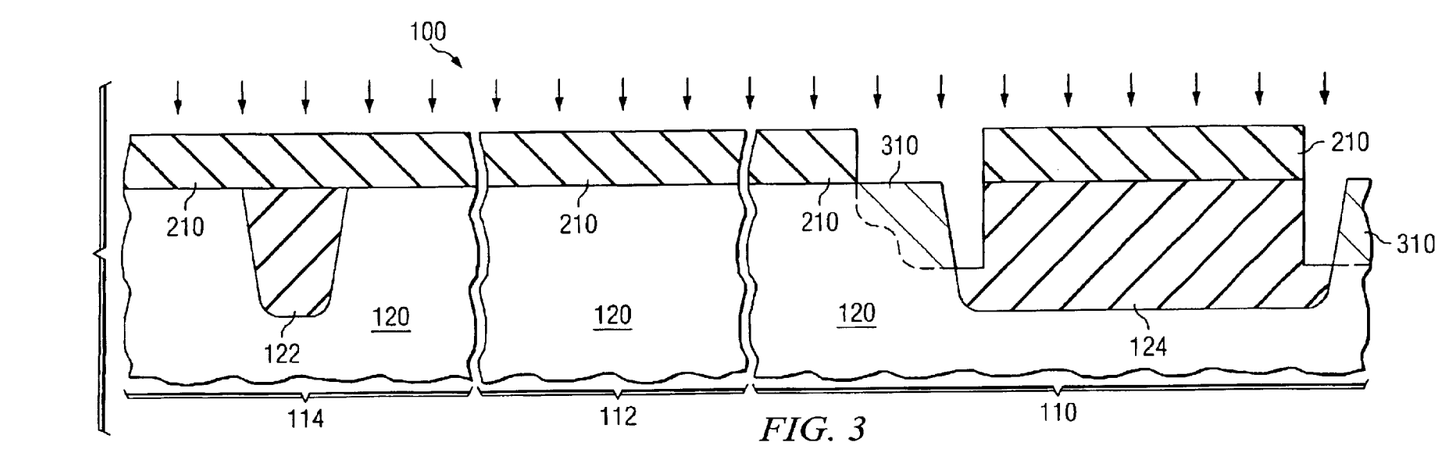

In FIG. 3, an ion implant is performed on the exposed portions of the substrate 120 of the wafer 100 of FIG. 2 to form bottom electrodes 310. A portion of the horizontal surface of the substrate extending along the sidewall of the STI becomes doped, thereby forming the bottom electrodes 310. In the preferred embodiment in which the p-type dopant is used, the exposed portion of the substrate is implanted using, for example, phosphorous ions at a dose of about $1e^{12}$ to about $5e^{14}$ atoms/cm$^2$ and at an energy of about 5 to about 40 KeV. Alternatively, the exposed portions of the substrate 120 may be doped using nitrogen, arsenic, antimony, or the like. Furthermore, an n-type dopant, such as boron, aluminum, gallium, indium, or the like, may be used. The bottom electrodes 310 will become the bottom electrodes of storage capacitors in the volatile memory region 110.

Figure 4:
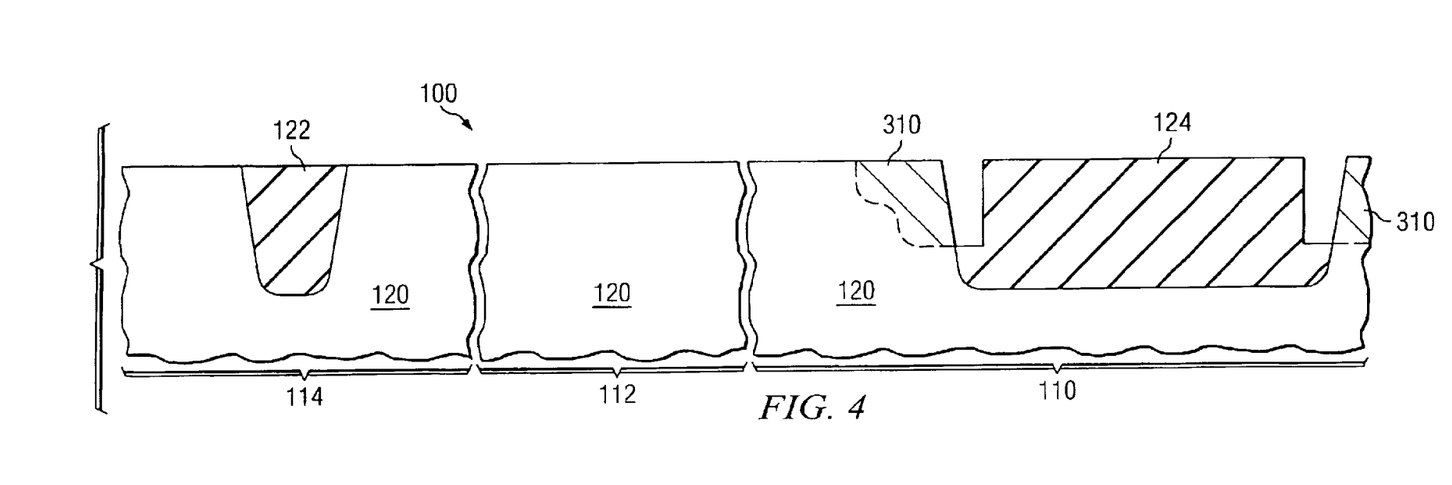

FIG. 4 illustrates the wafer 100 of FIG. 3 after the patterned mask 210 has been removed. In the preferred embodiment in which the patterned mask 210 comprises a pad oxide layer and a $Si_3N_4$ layer, the patterned mask 210 may be removed, for example, by a wet dip in a phosphoric acid solution of phosphoric acid ($H_3PO_4$) and water ($H_2O$). Other solutions that may be used to remove the patterned mask 210 include a dilute hydrofluoric acid, a mixture of concentrated sulphuric acid and hydrogen peroxide, or the like. The patterned mask 210 may also be removed using an oxygen plasma ashing process.

Figure 5:
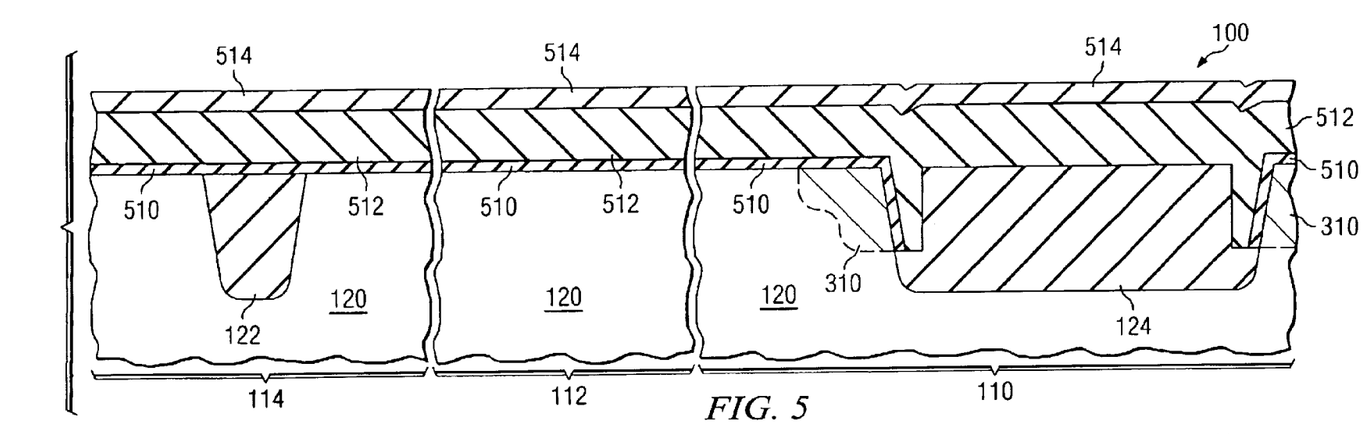

FIG. 5 illustrates the wafer 100 of FIG. 4 after a dielectric layer 510, a polysilicon layer 512, and a hard mask 514 have been formed. The dielectric layer 510 will be patterned in subsequent processing steps to form the dielectric layer of a capacitor of a 1T-RAM cell and a tunneling layer of a split-gate transistor non-volatile memory cell. The dielectric layer 510 may be an oxide layer formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In the preferred embodiment, however, the dielectric layer 510 is a silicon dioxide material formed by a wet or dry oxidation process, such as a furnace oxidation in an ambient environment of $O_2$, $H_2O$, a combination thereof, or the like, or an in-situ steam generation (ISSG) process in an ambient environment of $O_2$, $H_2O$, NO, a combination thereof, or the like. In the preferred embodiment, the dielectric layer 510 is about 20 Å to about 150 Å in thickness, but more preferably about 90 Å in thickness.

The polysilicon layer 512 is formed on the dielectric layer 510 and will be patterned in subsequent processing steps. The polysilicon layer 512 is generally a semiconductor material such as polysilicon, amorphous silicon, or the like. The polysilicon layer 512 may be deposited doped or undoped. For example, the polysilicon layer 512 may be deposited undoped by low-pressure chemical vapor deposition (LPCVD). Once applied, the polysilicon may be doped with, for example, phosphorous ions at a dose of about $1 e^{12}$ to about $1e^{15}$ atoms/cm$^2$ and at an energy of about 5 to about 100 KeV to form a PMOS device. Alternatively, the polysilicon may be doped using nitrogen, arsenic, antimony, or the like, or may be doped with an n-type dopant such as boron, aluminum, gallium, indium, or the like. The polysilicon layer 512 may also be deposited, for example, by furnace deposition of an in-situ doped polysilicon. The polysilicon layer 512 is preferably about 500 Å to about 2000 Å in thickness, but more preferably about 1200 Å in thickness.

The hard mask 514 formed on the polysilicon layer 512 preferably comprises a silicon nitride ($Si_3N_4$) layer about 500 Å to about 1500 Å in thickness. The $Si_3N_4$ layer may be formed using CVD techniques using silane and ammonia as precursor gases, and deposition temperatures ranging from 550° to 900° C. Other mask materials can be used to form the hard mask 514, such as a nitrogen containing layer other than $Si_3N_4$. For example, the hard mask 514 could comprise silicon nitride $Si_xN_y$, silicon oxynitride $SiO_xN_y$, silicon oxime $SiO_xN_y:H_z$, or a combination thereof.

Figure 6:
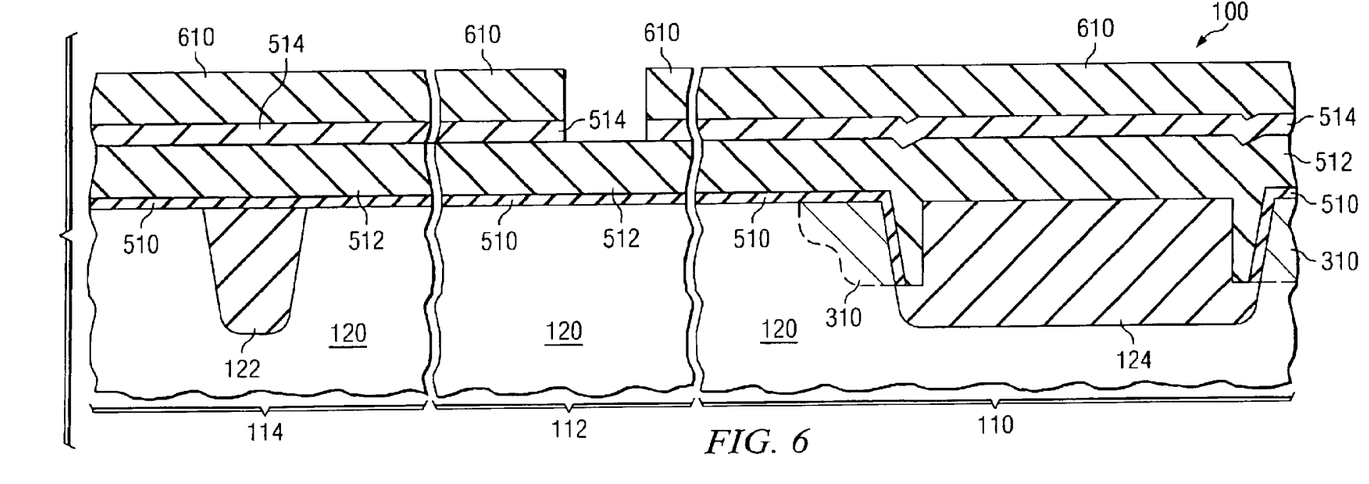

In FIG. 6, the hard mask 514 is patterned to expose the area of the polysilicon layer 512 that is to become a poly-oxide layer of a split-gate transistor. As illustrated in FIG. 6, the hard mask 514 is preferably patterned by applying, exposing, and developing a patterned mask 610. After the patterned mask 610 has been patterned, an etching step is performed to remove a portion of the hard mask 514. One commonly used method of etching the hard mask 514 is a dry plasma etch process using fluorine chemistry to etch the silicon nitride.

Figure 7:
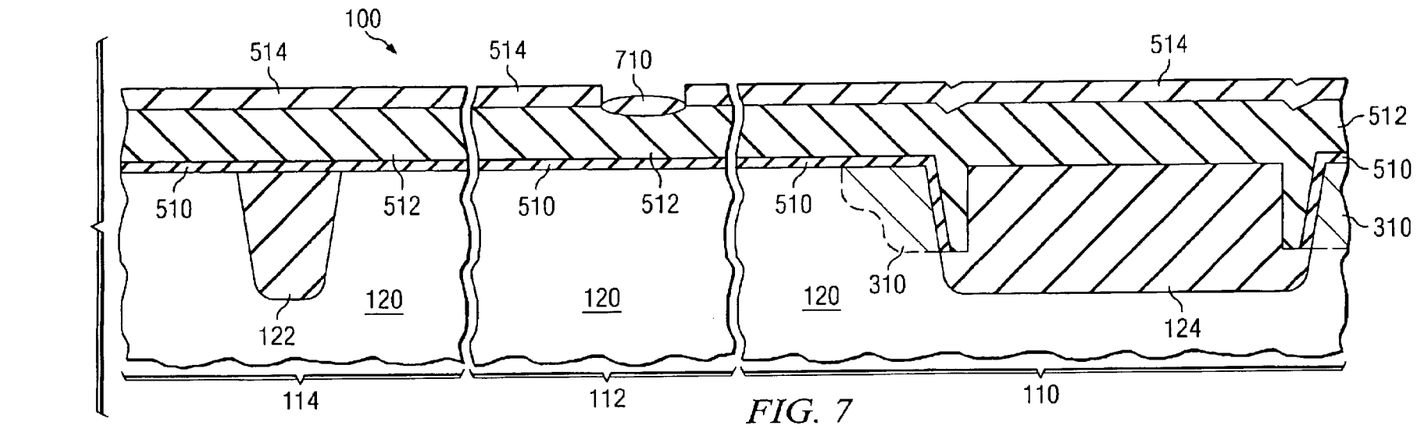

FIG. 7 illustrates wafer 100 of FIG. 6 after the patterned mask 610 (FIG. 6) has been removed and an oxide layer 710 has been formed on the exposed portion of the polysilicon layer 512. It should be noted that the hard mask 514 remains and is used as a mask in the oxidation of the polysilicon layer 512. The patterned mask 610 is preferably removed, for example, by a dry plasma ashing process that removes the patterned mask 610, but leaves the hard mask 514 substantially intact.

The oxide layer 710 may be formed by oxidizing the exposed portions of the polysilicon layer 512. The oxidation may be performed, for example, by a wet or dry oxidation process. Preferably, however, a wet oxidation process at a temperature of about 800° C. to about 1,000° C. is used. The oxide layer 710 is preferably about 800 Å to about 2,000 Å in thickness.

Figure 8:
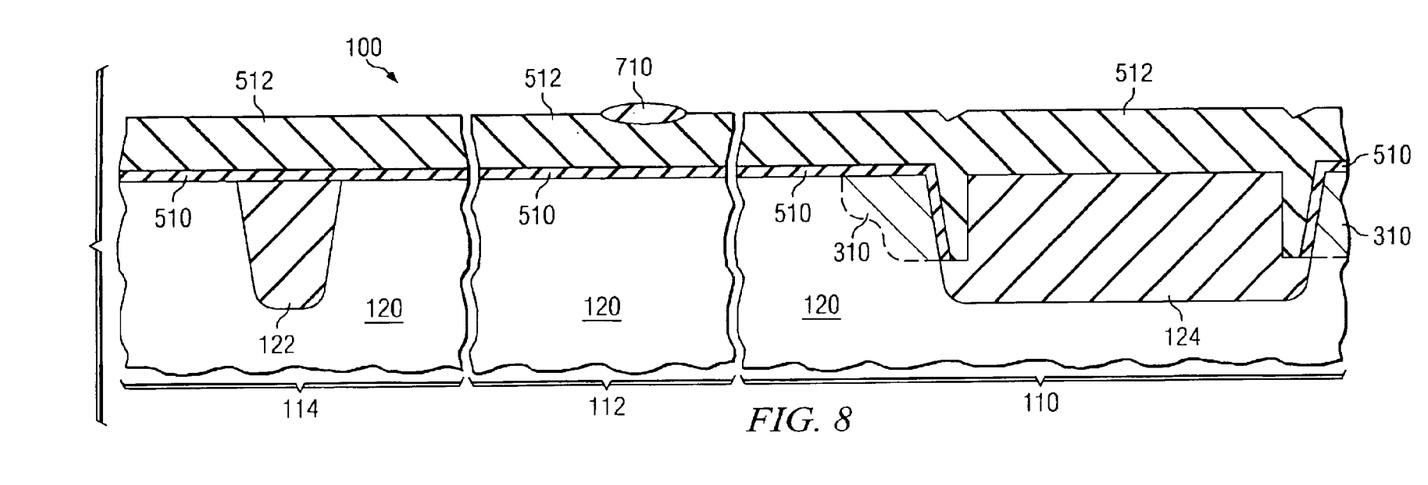

As illustrated in FIG. 8, the hard mask 514 is removed after the exposed portions of the polysilicon layer 512 have been oxidized. In the preferred embodiment in which the hard mask 514 comprises $Si_3N_4$, the hard mask 514 may be removed, for example, in a wet dip in dilute hydrofluoric acid. Another commonly used wafer cleaning solution is a mixture of concentrated sulphuric acid and hydrogen peroxide, commonly referred to as piranha solution. A phosphoric acid solution of phosphoric acid ($H_3PO_4$) and water ($H_2O$) may also be used to remove the hard mask 514.

Alternatively, the oxidation of the exposed portions of the polysilicon layer 512 is performed prior to removing the patterned mask 610 (FIG. 6). In this alternative embodiment, the hard mask 514 and the patterned mask 610 may be removed in a wet dip of hydrofluoric acid or a phosphoric acid ($H_3PO_4$) solution.

Figure 9:
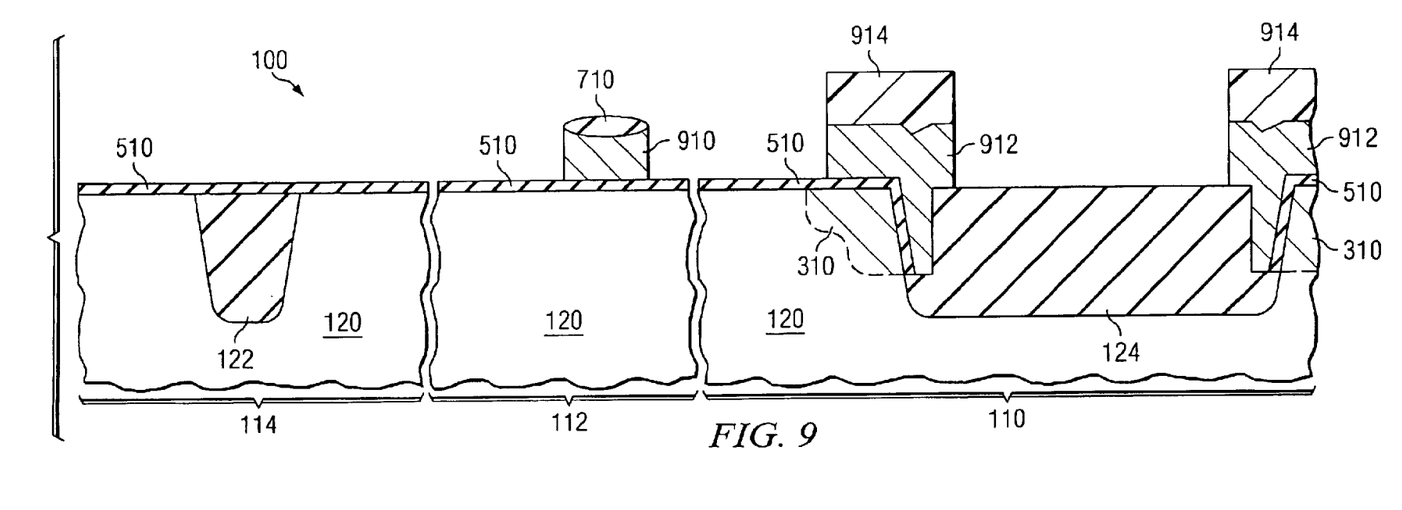

FIG. 9 illustrates the wafer 100 of FIG. 8 after a floating gate 910 and capacitor upper electrodes 912 have been formed. The floating gate 910 and the capacitor upper electrodes 912 are formed of portions of the polysilicon layer 512 (FIG. 8) that have been patterned. Preferably, the polysilicon layer 512 is patterned by etching, wherein the mask used for etching the polysilicon layer 512 preferably comprises the oxide layer 710 that defines the floating gate 910 and a mask layer 914 that defines the capacitor upper electrode 912. The mask layer 914 may be, for example, a photoresist material that has been applied, exposed, and developed to pattern the capacitor upper electrodes 912.

After the polysilicon layer 512 has been patterned, the excess material may be removed, for example, by a wet or dry, anisotropic or isotropic, etch process. Preferably, the excess material of the polysilicon layer 512 is removed by a dry, anisotropic etch process.

Figure 10:
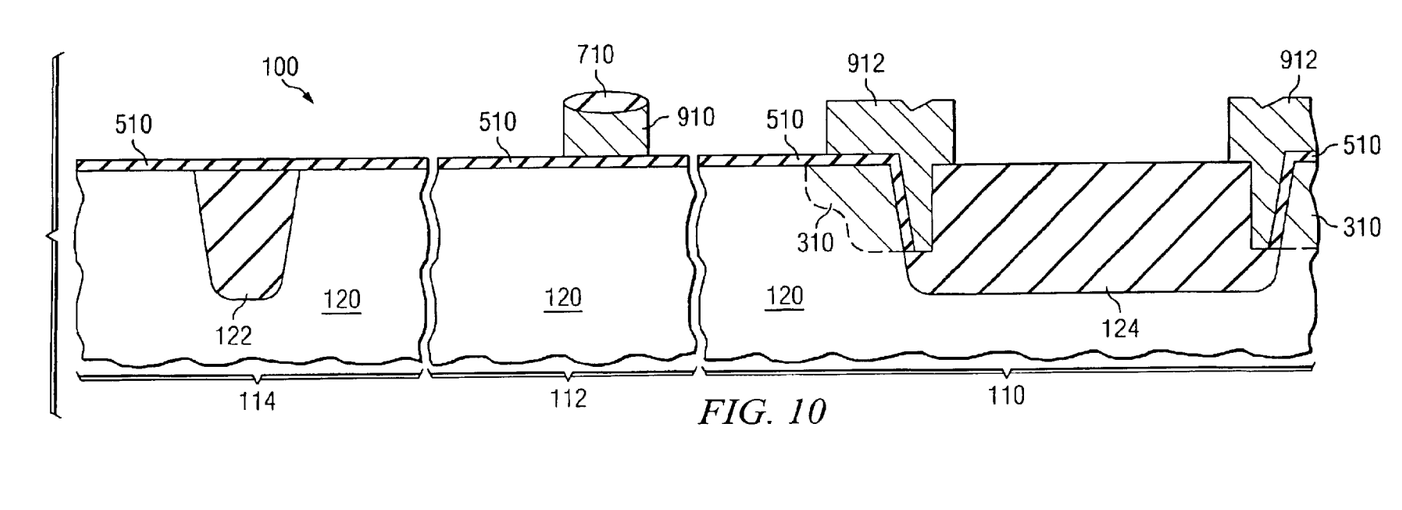

FIG. 10 illustrates the wafer 100 of FIG. 9 after the mask layer 914 (FIG. 9) has been removed. In the preferred embodiment in which the mask layer 914 is a photoresist, the mask layer 914 may be removed by a dry plasma ashing process. The plasma ashing process may be followed by a wet dip in a sulfuric acid ($H_2SO_4$) solution to clean the wafer and remove remaining photoresist material.

Figure 11:
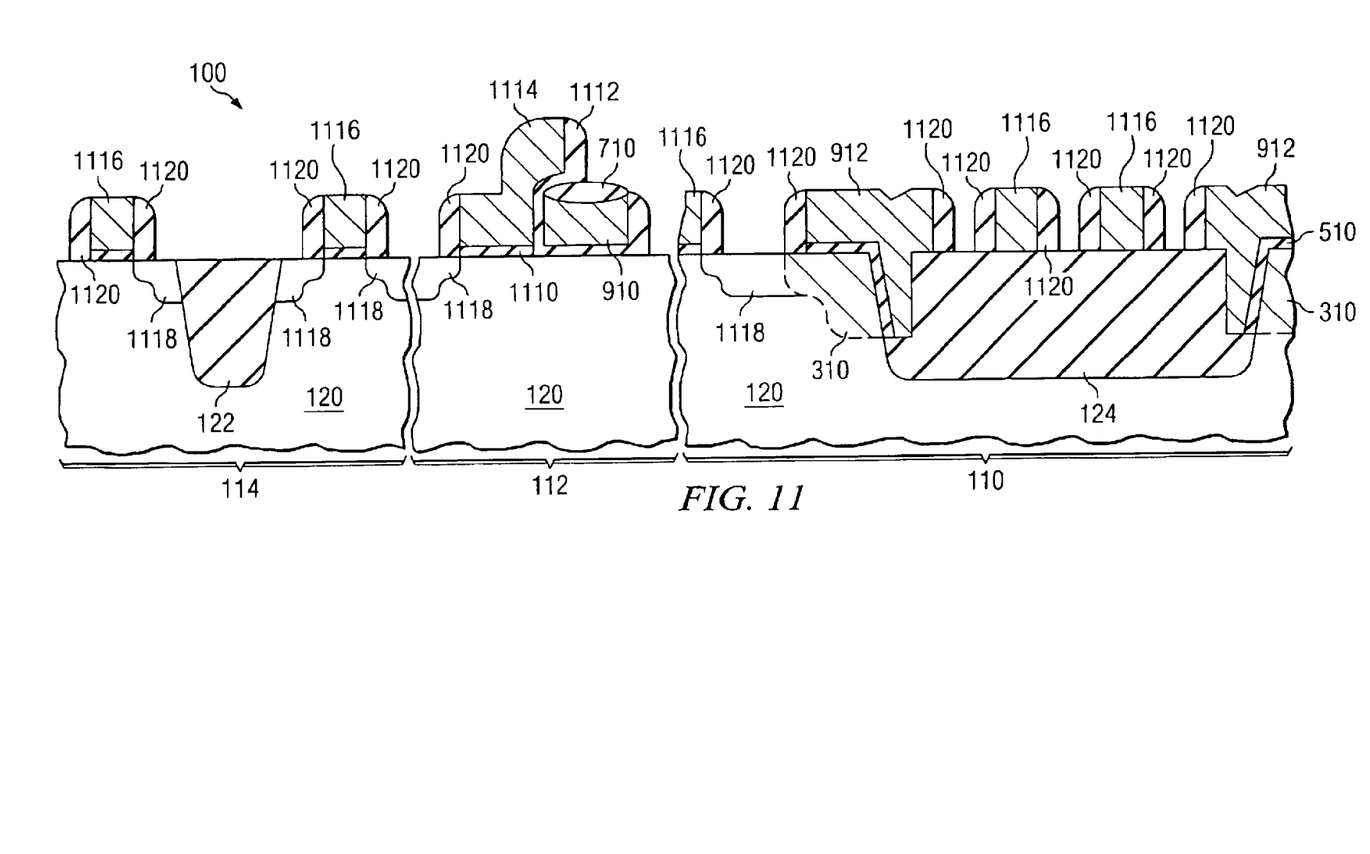

Thereafter, commonly used procedures may be used to complete fabrication of the semiconductor device. For example, FIG. 11 illustrates the wafer 100 of FIG. 10 after a gate oxide 1110 and an inter-poly-oxide 1112, split-gate transistor control gate 1114, transistor gates 1116, transistor source and drain implants 1118, transistor spacer formation 1120, and the like.

FIGS. 12–16 illustrate cross-section views of a wafer 200 during various steps of a second embodiment of the present invention in which a memory having a split-gate non-volatile memory cell and a 1T-RAM cell is fabricated. FIGS. 12–16 assume that a wafer has been prepared similar to that described above with reference to FIGS. 1–5. Accordingly, processes similar to those described above with reference to FIGS. 1–5 may be performed prior to performing the following steps described in reference to FIGS. 12–16.

Figure 12:
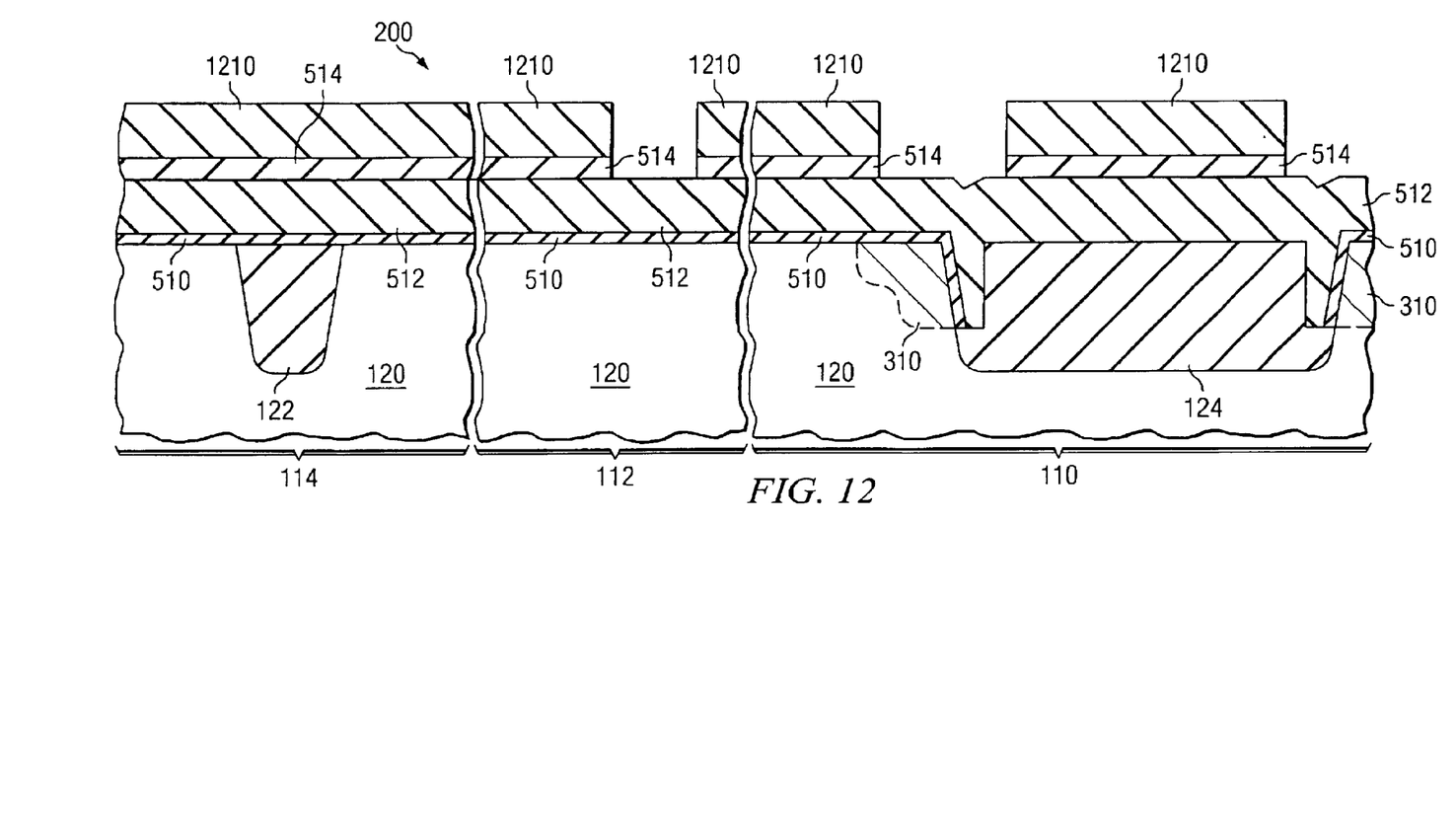
FIGS. 12–16 are cross-section views of a portion of a memory illustrating a second method embodiment of fabricating a non-volatile memory cell and a volatile memory cell in accordance with one embodiment of the present invention.

The process begins in FIG. 12, wherein wafer 200 is similar to wafer 100 of FIG. 6, except that the hard mask 514 is patterned to expose areas of the polysilicon layer 512 that is to become a poly-oxide layer of a split-gate transistor and the upper electrodes of capacitors of the 1T-RAM cell. The hard mask 514 is preferably patterned by applying, exposing, and developing a patterned mask 1210. After the patterned mask 1210 has been patterned, an etching step is performed to remove unwanted portions of the hard mask 514. One commonly used method of etching the hard mask 514 is a dry plasma etch process using fluorine chemistry to etch the silicon nitride.

Figure 13:
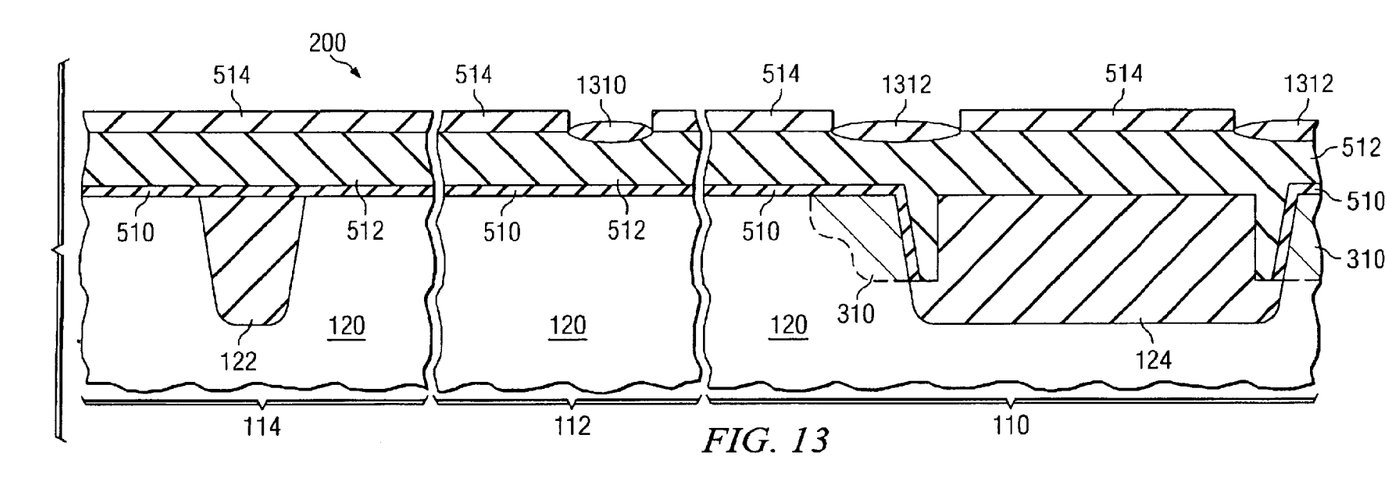

FIG. 13 illustrates wafer 200 of FIG. 12 after the patterned mask 1210 has been removed and poly-oxide layers 1310 and 1312 have been formed on the exposed portion of the polysilicon layer 512. The poly-oxide layer 1310 forms the poly-oxide layer of a split-gate transistor, and the poly-oxide layer 1312 acts as a mask for forming the upper electrodes of capacitors.

It should be noted that the hard mask 514 remains and is used as a mask in the oxidation of the polysilicon layer 512. The patterned mask 1210 is preferably removed, leaving the hard mask 514 substantially intact. The patterned mask 1210 may be removed, for example, by a dry plasma ashing process.

The poly-oxide layers 1310 and 1312 may be formed by oxidizing the exposed portions of the polysilicon layer 512. The oxidation may be performed, for example, by a wet or dry oxidation process. Preferably, however, a wet oxidation process at a temperature of about 800° C. to about 1,000° C. is used. The poly-oxide layer 1310 is preferably about 800 Å to about 2,000 Å in thickness.

Figure 14:
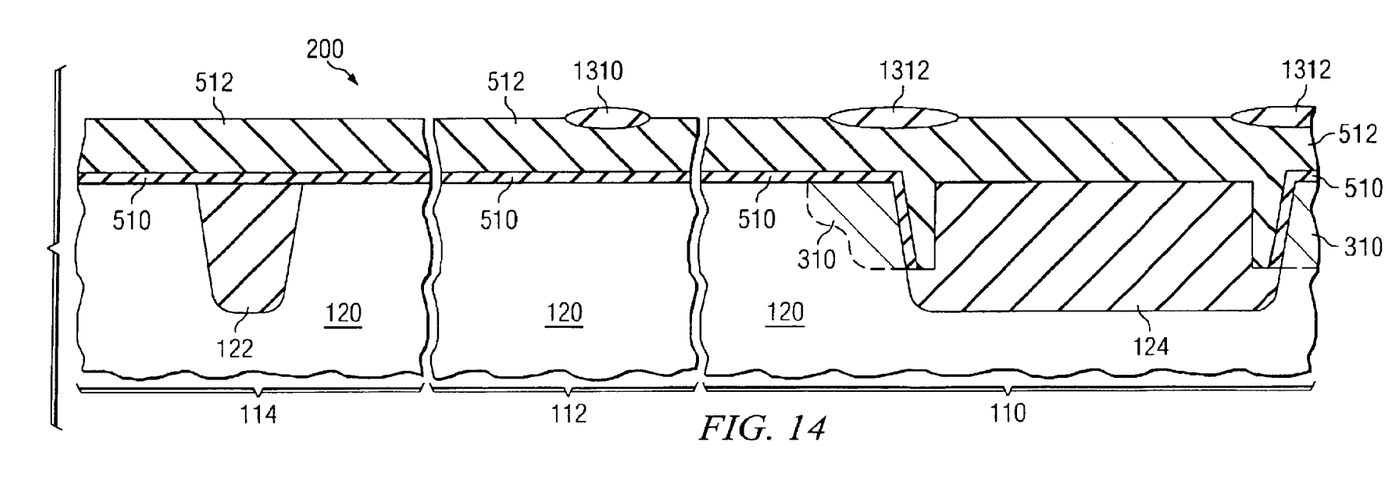

In FIG. 14, the hard mask 514 is removed after the exposed portions of the polysilicon layer 512 have been oxidized. The hard mask 514 may be removed, for example, in a wet dip in dilute hydrofluoric acid. A phosphoric acid solution of phosphoric acid ($H_3PO_4$) and water ($H_2O$) may also be used to remove the hard mask 514.

Alternatively, the oxidation of the exposed portions of the polysilicon layer 512 may be performed prior to removing the patterned mask 1210. In this embodiment, the hard mask 514 and the patterned mask 1210 may be removed in a wet dip of hydrofluoric acid or a phosphoric acid solution of phosphoric acid ($H_3PO_4$) and water ($H_2O$).

Figure 15:
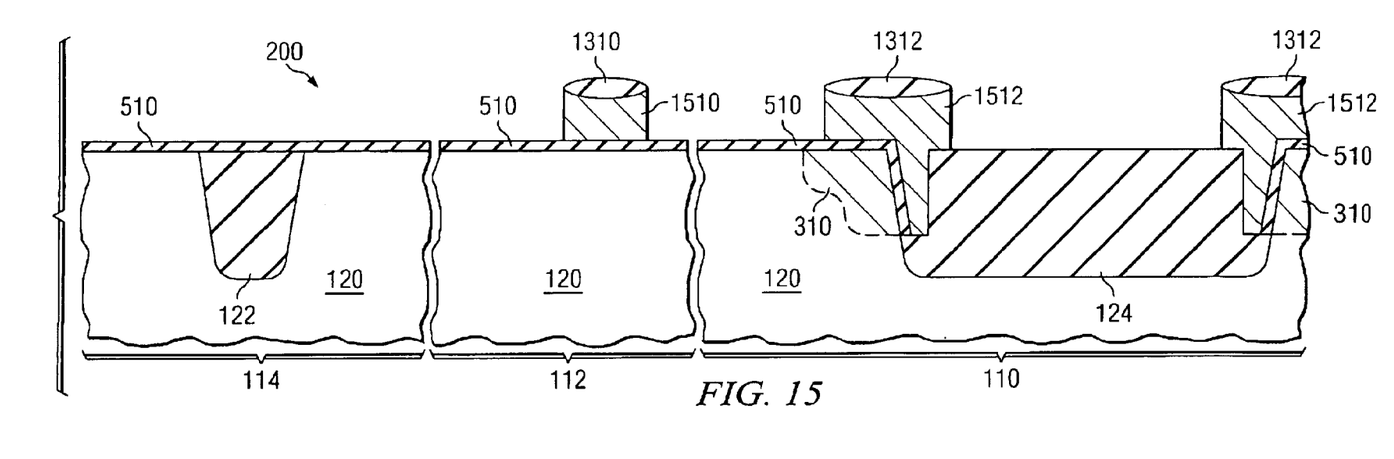

FIG. 15 illustrates the wafer 200 of FIG. 14 after a floating gate 1510 and capacitor upper electrodes 1512 have been formed. The floating gate 1510 and the capacitor upper electrodes 1512 are formed of portions of the polysilicon layer 512 (FIG. 14) that has been patterned and the excess material removed. The mask used for etching comprises the poly-oxide layers 1310 and 1312.

After the polysilicon layer 512 has been patterned, the excess material of the polysilicon layer 512 may be removed, for example, by a wet or dry, anisotropic or isotropic, etch process. Preferably, the polysilicon layer 512 is removed by a dry, anisotropic etch process.

It should be appreciated that in this second method embodiment, an additional mask layer is not required to pattern the capacitor upper electrodes 1512 because the poly-oxide layers 1312 act as a mask during the etching process of the polysilicon layer 512. Furthermore, because a photoresist layer is not used as discussed above with reference to FIG. 9, the step to remove the photoresist material (see FIG. 10) does not need to be performed.

Figure 16:
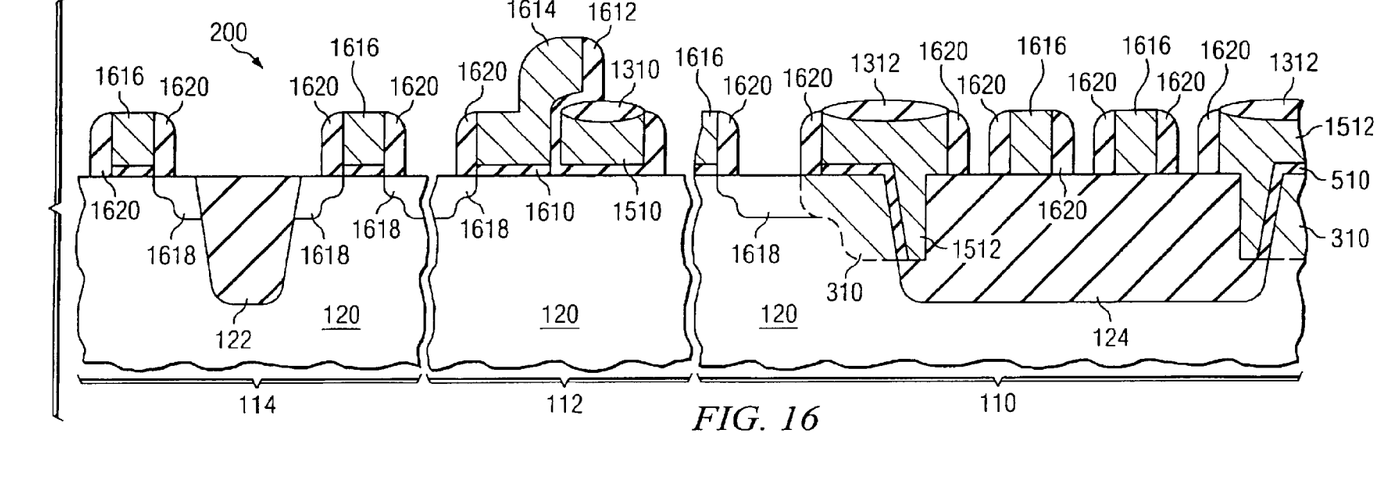

Thereafter, commonly used procedures may be used to complete fabrication of the semiconductor device. For example, FIG. 16 illustrates the wafer 200 of FIG. 15 after a gate oxide 1610, an inter-poly-oxide 1612, a split-gate transistor control gate 1614, transistor control gates 1161, transistor source and drain implants 1618, transistor spacer formation 1620, and the like have been formed.

Although particular embodiments of the invention have been described in detail, it is understood that the invention is not limited correspondingly in scope, but includes all changes, modifications, and equivalents coming within the spirit and terms of the claims appended hereto. For example, different types of materials may be used for the masks and device layers, different etching processes may be used, other types of devices may be fabricated, other types of structures may be fabricated, and the like. Accordingly, it is understood that this invention may be extended to other structures and materials, and thus, the specification and figures are to be regarded in an illustrative rather than a restrictive sense.

What is claimed is:

1. A method of forming a memory, the method comprising:
   providing a substrate having a non-volatile memory region and a volatile memory region;
   forming bottom electrodes of storage capacitors in the volatile memory region;
   forming a first dielectric layer on the substrate;
   forming a first polysilicon layer on the first dielectric layer;
   forming a poly-oxide layer of a split-gate transistor in the non-volatile memory region;
   etching the first polysilicon layer to form a floating gate of a split-gate transistor;
   forming a top electrode of a capacitor; and
   forming a control gate of the split-gate transistor.

2. The method of claim 1 wherein the step of forming bottom electrodes is performed by:
   patterning a mask to expose portions of the substrate where the storage capacitors are to be located; and
   implanting the exposed portions of the substrate.

3. The method of claim 2 wherein the mask includes a pad oxide layer.

4. The method of claim 2 wherein the mask includes a silicon nitride layer.

5. The method of claim 1 wherein the step of forming the poly-oxide is performed by:
   forming a second mask on the first polysilicon layer;
   patterning the second mask to expose portions of the first polysilicon layer; and
   oxidizing the exposed portions of the first polysilicon layer.

6. The method of claim 5 wherein the second mask is a hard mask comprising silicon nitride.

7. The method of claim 6 wherein the step of patterning the second mask includes etching the second mask using a dry plasma etch process.

8. The method of claim 1 wherein the steps of etching the first polysilicon layer to form a floating gate and forming the top electrode are performed in the same process step.

9. The method of claim 1 wherein the steps of forming the control gate and forming the top electrode are performed in the same process step.

10. A method of forming a memory, the method comprising:
    providing a substrate;
    forming bottom electrodes of a capacitor;
    forming a first dielectric layer on the substrate;
    forming a first polysilicon layer on the first dielectric layer;
    oxidizing a first portion of the first polysilicon layer to form a first poly-oxide layer of a split-gate transistor;
    oxidizing a second portion of the first polysilicon layer to form a second poly-oxide layer to define a portion of the first polysilicon layer that is to become a top electrode of a capacitor;
    etching the first polysilicon layer to form a floating gate of a split-gate transistor and a top electrode of a capacitor; and
    forming a control gate of the split-gate transistor.

11. The method of claim 10 wherein the capacitor is formed along the edge of a shallow trench isolation.

12. The method of claim 10 wherein the step of forming bottom electrodes is performed by:
    patterning a mask to expose portions of the substrate where the storage capacitors are to be located; and
    implanting the exposed portions of the substrate.

13. The method of claim 12 wherein the mask includes a pad oxide layer.

14. The method of claim 12 wherein the mask includes a silicon nitride layer.

15. The method of claim 10 wherein the step of oxidizing the first portion is performed by:
    forming a second mask on the first polysilicon layer;
    patterning the second mask to expose portions of the first polysilicon layer; and
    oxidizing the exposed portions of the first polysilicon layer.

16. The method of claim 15 wherein the second mask is a hard mask comprising silicon nitride.

17. The method of claim 16 wherein the step of patterning the second mask includes etching the second mask using a dry plasma etch process.

18. The method of claim 10 wherein the step of oxidizing the second portion is performed by:
    forming a third mask on the first polysilicon layer;
    patterning the third mask to expose portions of the first polysilicon layer; and
    oxidizing the exposed portions of the first polysilicon layer.

19. The method of claim 18 wherein the third mask is a hard mask comprising silicon nitride.

20. The method of claim 19 wherein the step of patterning the third mask includes etching the third mask using a dry plasma etch process.

21. The method of claim 10 wherein the step of forming a floating gate of a split-gate transistor and a top electrode of a capacitor is performed in the same process step.

* * * * *